United States Patent [19]
Ratzel et al.

[11] Patent Number: 5,248,942
[45] Date of Patent: Sep. 28, 1993

[54] METHOD OF EXCITING A SAMPLE FOR NMR TOMOGRAPHY

[75] Inventors: Dieter Ratzel, Rheinstetten; Erich Treiber, Stuttgart; Bernhard Ströbel, Darmstadt, all of Fed. Rep. of Germany

[73] Assignee: Bruker Medizintechnik, Rheinstetten, Fed. Rep. of Germany

[21] Appl. No.: 795,510

[22] Filed: Nov. 21, 1991

[30] Foreign Application Priority Data

Nov. 23, 1990 [DE] Fed. Rep. of Germany ....... 4037381

[51] Int. Cl.$^5$ .......................................... G01R 33/20
[52] U.S. Cl. ................................................. 324/309
[58] Field of Search ............... 324/300, 307, 309, 310, 324/311, 312, 313, 314, 318, 322; 128/653.2

[56] References Cited

U.S. PATENT DOCUMENTS 4,595,899 6/1986 Smith et al. ..................... 335/216
4,692,704 9/1987 Gray ................................ 324/318

OTHER PUBLICATIONS

"Experimental Pulse NMR, A Nuts and Bolts Approach", E. Fukushima, S. Roeder, Addison Wesley, MA, 1981.
"Pulse and Fourier Transform NMR", T. C. Farrar, E. D. Becker, Academic Press, 1971.

Primary Examiner—Michael J. Tokar
Attorney, Agent, or Firm—Cesari and McKenna

[57] ABSTRACT

In particular with 3D tomography, it is necessary to acquire a large number of individual spectra. Therefore it is advisable to reduce the time needed for the acquisition of a single spectrum without loosing too much in signal-to-noise ratio. To a significant extent, this time is determined by the relaxation time of the spins. Prior to each excitation a significant quantity of these spins have to return into their equilibrium (z-direction of the homogeneous magnetic field) in order to create a usable signal with the next excitation. For spins with long relaxation times $T_2$ this time can be reduced by a $-90°$ pulse 12 that coincides with the center of the last spin echo 9 with appropriate application of the gradient fields. This $-90°$ pulse returns the x-y magnetization that exists in the x-y plane into the z-direction. The diagnostic relevance can be significantly increased by such a procedure.

20 Claims, 3 Drawing Sheets

METHOD OF EXCITING A SAMPLE FOR NMR TOMOGRAPHY

FIELD OF THE INVENTION

The invention concerns a method for exciting a sample in NMR tomography in which the sample is subjected to the homogeneous magnetic field and magnetic-field gradients common to FT or back-projection tomography, and is excited by a 90° pulse followed by a train of 180° pulses, whereby measurable nuclear induction signals, commonly known as spin-echos, are produced.

DESCRIPTION OF THE PRIOR ART

The production and measurement of NMR signals, involving the influence of gradients along different orthogonal axes achieved through the employment of common NMR-tomography techniques leads to the production of signals which characterize a multitude of spatial volume elements of the sample being examined. Through the selection of signals from particular volume elements, cross sectional images at arbitrary spatial locations throughout the sample may be produced.

A disadvantage of NMR-tomography, especially in the case of 3-dimensional (3D) data sets, is that it is necessary to collect a very large number of individual spectra. Consequently, long examination times result. The repetition rate with which the individual spectrum can be taken depends on the fact that before each new excitation, the previous excitation must decay since otherwise excited nuclear spins are not located in the defined initial state required for the production of useful nuclear induction signals and diagnostically useful images. In this respect, distortions are largest for nuclear spins with the longest relaxation times, which, in turn, have the greatest diagnostic significance since they lie in the range of tumors, edematous tissue, demyelinated nerve fibers, cysts, etc. A reduction in the measurement repetition time therefore leads to images which are erroneous in precisely this region of long relaxation times and are thereby, diagnostically speaking, useless. Conversely, if one lengthens the measurement repetition time to optimize the nuclear induction signals from spins with long relaxation times, the examination time becomes intolerable for the patient and highly inefficient from an economical point of view.

It is therefore of great importance, not only in the three dimensional case but also in the more conventional two dimensional measurements to employ the shortest possible measurement times.

EP- 0 121 312 A2 (U.S. Pat. No. 4,579,121) describes a method wherein, following the excitation of a sample with a 90° high frequency pulse, a nuclear induction signal is read out. During the 90° pulse a so-called slice gradient is applied and later, during the acquisition of the signal, a read-out gradient is employed. Finally, through the incorporation of a 180° RF pulse, again applied in the presence of a slice gradient, the nuclear spins of a particular slice are inverted, leading to the occurrence of a spin-echo. In order to improve the signal-to-noise ratio, one can also collect the first half, or rising part, of the spin-echo under the previously mentioned read-out gradient. Alternatively, it is possible to reduce the resultant measurement time by a factor of 2 by altering the read-out gradient, that is to say, going to a new projection step. At the center of the spin-echo formed, one can then irradiate a 90° pulse to drive the nuclear spins back to a position parallel to the orientation of the magnetic field. This method is known in the art of NMR-spectroscopy as the DEFT (driven equilibrium Fourier transform) technique. Once they have been returned to the orientation of the magnetic field, the nuclear spins are then available for a new excitation by a subsequent 90° pulse such as the initial one.

Ep- 0 121 312 A2 alternatively describes a method with which, instead of returning the nuclear spins to a position parallel to the orientation of the magnetic field, one may produce and analyze additional spin-echoes through the use of further 180° pulses.

In U.S. Pat. No. 4,818,940 which is based on U.S. Pat. No. 4,697,148 a rapid acquisition method (RARE) is proposed whereby, to acquire NMR tomograms according to the 2D-FT-method, a sample is excited using a CPGM spin-echo sequence, whereby following each 180 degree pulse of the sequence, a phase encoding gradient is changed, such that each spin-echo is newly phase-encoded. The additional gradient switchings are implemented in a manner that ensures the preservation of the Meiboom-Gill condition. In extreme cases it is thereby possible to generate a complete image with a single excitation, that is to say, with one 90° pulse followed by a series of 180° pulses.

Through use of this technique it is possible to acquire images, of nuclear spins possessing long relaxation times, within examination times of less than 2 minutes. However, in order to achieve the desired contrast, long repetition times of 3-4 seconds are still required. An improved method is needed with which these waiting times can be substantially reduced, such that images depicting signal from nuclear spins with long relaxation times may be obtained in 10-30 seconds so that data acquisition can be completed in a time interval within which a person can hold his breath.

Furthermore, an improved method, in conjunction with the RARE method is needed in order to facilitate the collection of a three dimensional spin-echo data in the range of nuclear spins with long relaxation times.

Accordingly, it is the underlying purpose of the invention, to improve the above described methods in such a manner that use of reduced repetition times, and thereby acceptable total measurement times is possible without distorting the image contributions from nuclear spins with long relaxation times.

BRIEF SUMMARY OF THE INVENTION

This purpose is achieved in accordance with the invention in that each sequence of 180° pulses is ended with a flip-back pulse (FB), by way of example, a −90° pulse the beginning of which coincides with the spin-echo maximum generated by the last 180° pulse, whereby the gradient fields are adjusted so that the nuclear spin phases at the time of occurrence of the 180° pulses are the same, and the FB pulse is irradiated at a point in time when all the spin momenta are in phase.

In accordance with the present invention, the FB pulse closing the sequence of 180° pulses rotates the spin momenta, which are located in a plane perpendicular to the homogeneous magnetic field, back into the direction of this homogeneous magnetic field, so that no additional time is needed for their relaxation. Since the FB pulse coincides with the maximum of the spin-echo produced by the last 180° pulse, and since the pulse sequence and gradient fields are so adjusted, nuclear spin momenta with long $T_2$ which are still located in the plane perpendicular to the direction of the homogeneous magnetic field are in phase when the FB pulse occurs, so that they experience the full effect of the FB pulse and will be reorientated in a direction parallel to the magnetic field. In this manner, the waiting time following the FB pulse before the next acquisition of an individual spectrum can be significantly shortened without a significant deterioration in image quality in particular with respect to the diagnostically interesting region of long relaxation times, with the total image taking time being substantially reduced.

The invention will be further described and elaborated upon through the following series of figures and diagrams. Shown are:

DETAILED DESCRIPTION OF THE PREFERRED EMBODIMENT

Figure 1A:
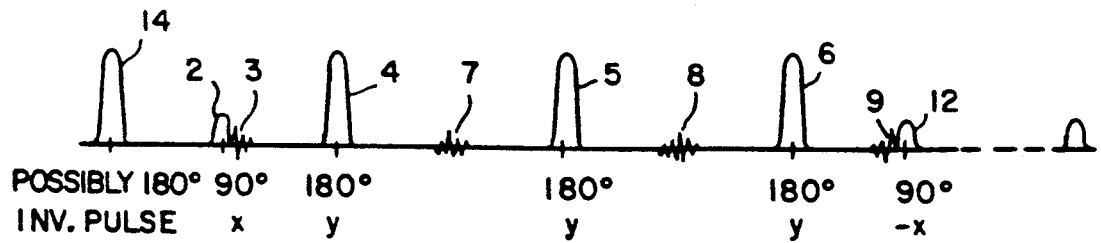
FIGS. 1A–1F. A timing-diagram of the RF pulses, gradient fields and signals as well as the resulting magnetization in a method according to the invention.
Figure 1B:
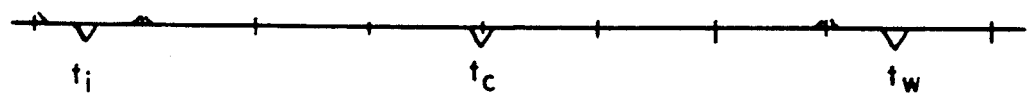
Figure 1C:
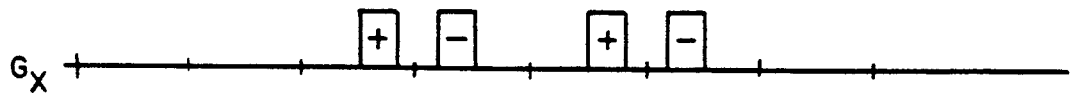
Figure 1D:
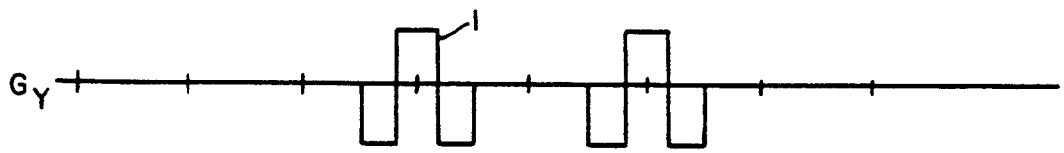
Figure 1E:
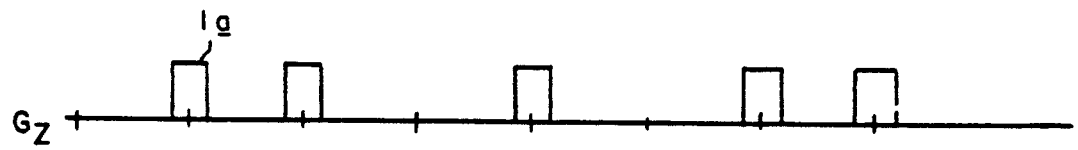
Figure 1F:
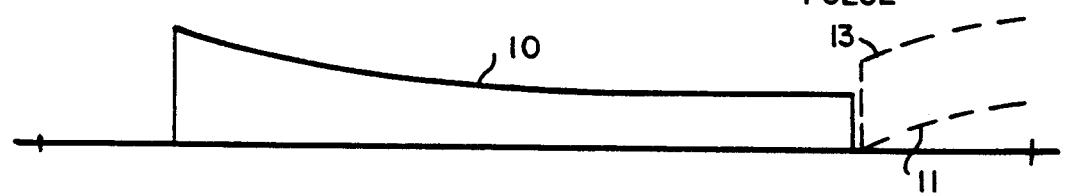
Figure 2A:
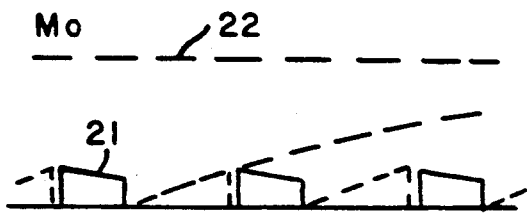
FIGS. 2A–2D. A diagram to illustrate the contrast improvement with the method in accordance with the invention between nuclear spin momenta with short and long $T_2$ relaxation times.
Figure 2B:
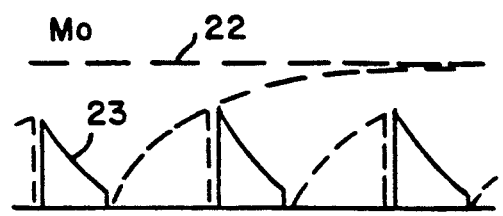
Figure 2C:
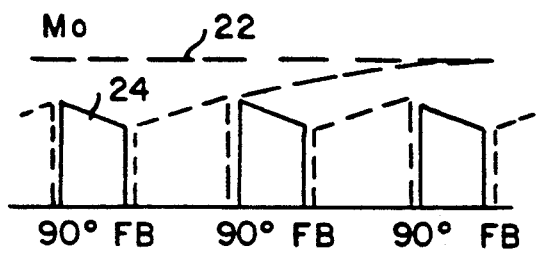
Figure 2D:
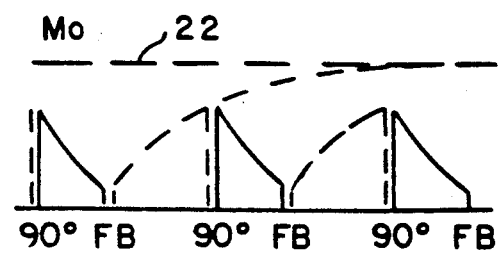

As is known in the art of NMR tomography, the sample under investigation—usually the human body or a part thereof—is subjected to a strong homogeneous magnetic field $B_o$, the direction of which usually is assigned to the z-axis of a rectangular coordinate system. The magnetic spins of the sample are usually aligned along the z-direction due to this magnetic field, if there are no other external influences. The information necessary for image reconstruction can only be extracted from the rf signals created by spins rotating around z-direction in the x-y plane. These signals are called nuclear induction signals. Towards this end, the spins in the areas to be imaged have to be rotated away from the z-direction by appropriate irradiation with high frequency waves, preferably by 90°, into the x-y plane.

The frequency with which spin momenta rotate in the x-y plane (Larmor frequency) depends on the strength of the magnetic field acting on the spins. Therefore it is possible to create a spatial variation of the Larmor frequency of the spin momenta of the sample by superimposing a magnetic gradient field upon the homogeneous magnetic field $B_o$, said gradient field also directed parallel to the z-direction but with a strength which varies along a selected direction. This direction of variation of the magnetic field in the presence of a gradient field is hereby designated as the gradient direction. Accordingly, the Larmor frequency of spins in the sample changes along the direction of the gradient due to the influence of the applied magnetic fields.

With 3D techniques all spins of the sample under investigation are excited as uniformly as possible. Towards this end, an rf pulse is irradiated onto the sample, the energy of which is sufficient to rotate the spins about an angle of 90° into the x-y plane (90° degree pulse). If this pulse is transmitted while the sample is subjected only to the homogeneous magnetic field $B_o$, the pulse can be narrow-banded since all spins in the homogeneous magnetic field possess the same Larmor frequency. Such a narrow-banded pulse can be of a fairly long duration, so that even a small rf pulse amplitude is—due to the relatively long duration—sufficient to achieve the rotation by 90°. However, if the sample is subjected to a gradient field during the excitation, the pulse has to be sufficiently broad-banded to encompass the entire range of different Larmor frequencies caused by the gradient field. Since a broadband pulse is of short duration, the application of high power pulses is necessary.

After excitation of all spins in the sample, the nuclear induction signals created by the excited spins are measured during the application of a read gradient, the frequency of these signals depending on the position of these spins with respect to the direction of the read gradient. Frequency selective detection of the nuclear induction signals can effectively restrict each single scan to the spins that are in a plane orthogonal to the read gradient. A plurality of such single scans, under variation of the direction of the read gradient and/or a phase encoding gradient permits information characteristic of a multitude of volume elements of the sample under investigation which is necessary for the reconstruction of the desired image slices.

To keep the total scan time within reasonable limits, the time for a single scan has to be restricted as much as possible. However, the limits to an increase in repetition rate are not only apparative in nature, but also involve the characteristics of the sample, namely the relaxation times of the sample nuclear spins. Particularly in areas of diagnostic interest such as tumors, edemas, centers of demyelinisation, cysts and so on, the spins have long relaxation times so that important information is contained in scanning areas where precisely these spins with long relaxation times are located. With a high repetition rate, a relaxation of these spins is not possible so that these important spins are not completely excited when the subsequent single scan is effected, and, consequently, the information content of these spins is lost.

The invention allows for a drastic reduction in the repetition time for the acquisition of single spectra without a significant loss of information with respect to spins with a large relaxation time $T_2$.

In FIG. 1 a procedure is shown that excites a sample in a way described above with a 90° pulse during which a slice selection gradient 1a is applied. The resulting NMR signal 3 is usually not analyzed. Instead a series of pulses is used where the 90° pulse 2 is followed by a series of 180° pulses 4, 5, and 6 that create, as is known in the art, echo signals 7, 8 and 9, analogous to a typical series of spin echo pulses, e.g. Carr-Purcell or Carr-Purcell-Meiboom Gill pulses. Due to the $T_2$ relaxation during the scan, the magnetization in the x-y plane that determines the amplitude of the echo 7, 8 and 9 decays. The magnetization in the x-y plane in FIG. 1 is illustrated by the line 10. If, in FIG. 1, the series of pulses is terminated with the third 180° pulse 6, the restoration of the z-magnetization starts after the last spin echo 9 under the influence of the homogeneous magnetic field $B_o$ as illustrated by the dashed line 11 in FIG. 1.

Nuclear induction signals of full amplitude can only be acquired if, at the time of excitation of the sample, a complete magnetization in z-direction exists, since, after application of a 90° pulse, it is this magnetization which creates the magnetization in the x-y plane responsible for the NMR signals. With long $T_2$ relaxation times, a long delay after the last spin echo 9 is, however, necessary in order to restore the complete magnetization in the z-direction. The invention can shorten this delay considerably by transmitting, at the time of the last echo 9, a −90° pulse 12 to the sample in consequence of which the magnetization of the x-y plane spins which, at the point of time at which the echo pulse 9 has its maximum, are all in phase is returned into the z-direction, so that the −90° FB pulse 12 creates a magnetization in z-direction equal to the residual magnetization that was present in the x-y plane at the time of application of the −90° pulse. From this value, which can be of considerable size especially in case of long relaxation times $T_2$, a large magnetization in z-direction can be achieved in a relatively short period of time as line 13 in FIG. 1 shows.

The gradient fields Gx, Gy, and Gz of FIG. 1 are adjusted so that the spins do not dephase in subsequent spin-echos 7,8,9 and so that all spins are in phase at the time of application of the FB pulse 12. Gx is applied with positive and negative phase sense before and after the occurrence of the spin-echo 7 respectively and is absent during the application of the FB pulse 12 and during the last spin-echo 9. Gy straddles the spin-echo pulse in a time symmetric fashion and includes symmetric negative going lobes before and after the spin-echo signals 7,8 to limit additional unwanted dephasing. Gy is absent during application of the FB pulse 12 and during the last spin-echo 9. Gz is applied during the 90° excitation pulse 2, the 180° pulses 4,5, and 6 and as well as during the FB pulse 12.

For the effectiveness of the −90° FB pulse in accordance with the invention, it is not necessary to wait for complete recovery of the z-magnetization after the application of the pulse. With shorter recovery times there will be an equilibrium NMR signal from spin momenta with long relaxation times that is significantly larger than the signal from spins with short relaxation times even after extended scan times. This guarantees that the information contained in the relaxation times $T_2$ is still sufficiently available even under utilization of rapid repetition rates.

FIG. 2 more closely shows how a contrast enhancement can be achieved by the application of the foldback or flip-back (FB) pulse in accordance with the invention. As shown in FIG. 2A for spins with long relaxation time $T_2$ the magnetization 21 is much smaller than the maximum possible value $M_o$ of the magnetization which is represented by the line 22, and the amplitude of the NMR signal is accordingly small. On the other hand the signal from spins with short relaxation times is larger in amplitude since a higher magnetization 23 (FIG. 2b) is achieved. However, with the application of a flip-back pulse, the magnetization 24 remains very large, so that the spin momenta create NMR signals with large amplitude (FIG. 2c), whereby there is only little effect due to the FB pulse on spins with short relaxation times and no increase of signal (FIG. 2d). Therefore, at the end of the scan-time there is significantly more signal from spin momenta in regions with long relaxation times as from other regions resulting in a diagnostically important increase of contrast.

Figure 3A:
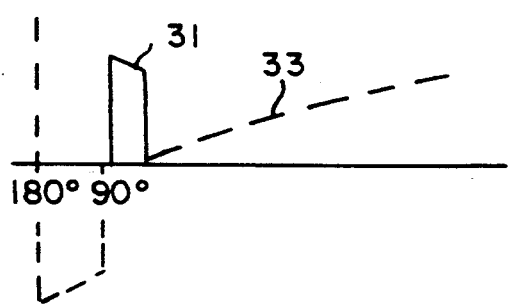
FIGS. 3A–3D. A diagram to illustrate the increase in contrast achieved through the application of the method according to the invention using excitation with a previous inversion pulse.
Figure 3B:
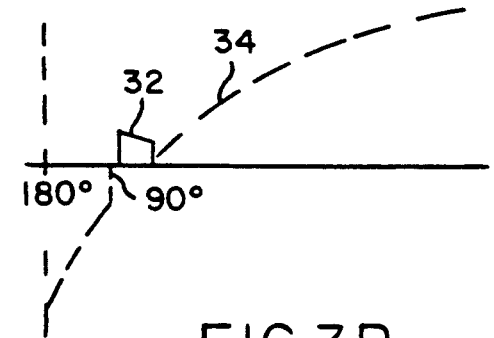

The method according to the invention can also be applied when a 180° inversion pulse 14 precedes the 90° excitation pulse 2 (FIG. 1). Short repetition times necessitate short inversion times. As shown in FIG. 3a and 3b, after application of the 90° pulse, the magnetizations 31 and 32 in the x-y plane are quite different, but the z-magnetization 33 or 34 and therefore the measurable NMR signal of the next spectrum will be smaller for spins with long relaxation times $T_2$ than for spins with short relaxation times. Compared to conventional techniques this distorts the images and makes them diagnostically unusable.

Figure 3C:
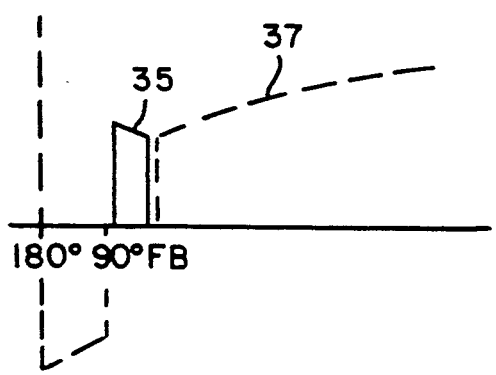
Figure 3D:
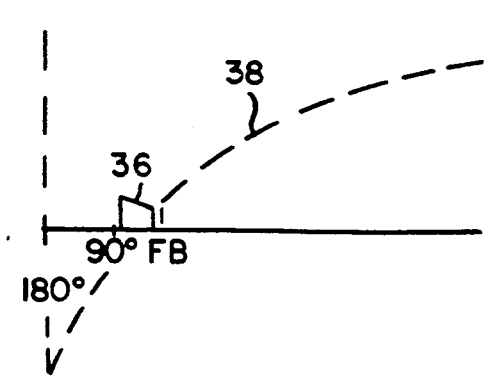
Figure 4A:
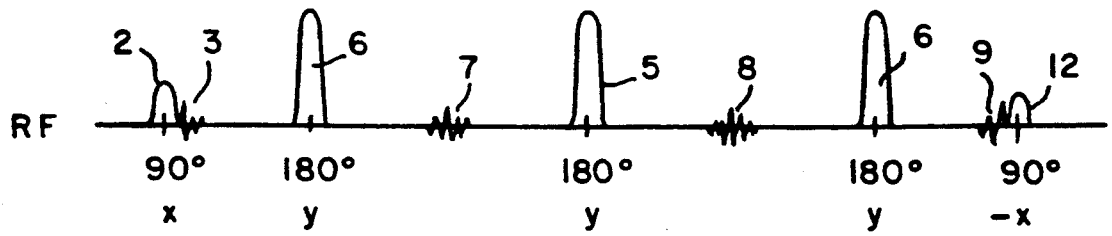
FIGS. 4A–4D. A time-diagram of the RF pulses, gradient fields and the signals in a further version of the method according to the invention.
Figure 4B:
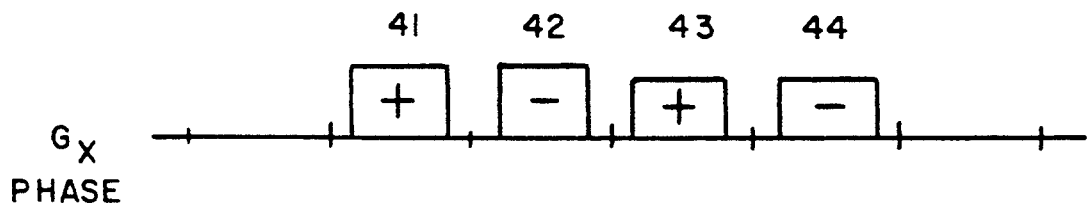
Figure 4C:
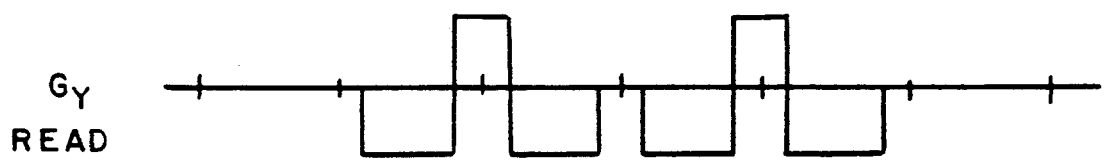
Figure 4D:
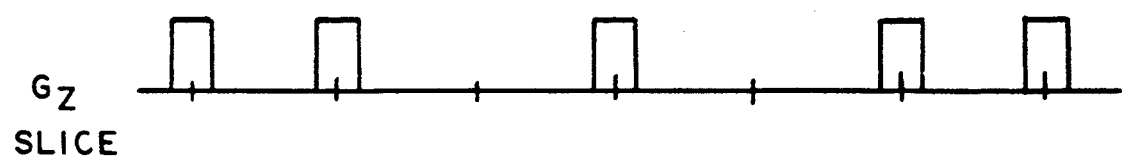

In this case the flip-back pulse helps as well as is clearly shown in FIG. 3c and 3d. Not only is the magnetization in the x-y plane 35 or 36 significantly larger for spins with long relaxation times than for spins with short relaxation times for the first acquisition spectrum, but this condition due to the FB pulse according to the invention persists during acquisition of the subsequent spectra (see curves 37,38 for the magnetization in z-direction).

The resulting stationary magnetization $M_s$ can be specified and optimized by solving the Bloch equations. An example for the case of the inversion recovery method with the FB pulse gives, $$M_s = M_o \frac{2e^{-t_i/T_1} - e^{-(t_i+t_w)/T_1}}{1 - e^{-(t_i+t_w)/T_1} e^{-t_c/T_2}}$$

$M_o$ = equilibrium magnetization after relaxation
$t_c$ = the time the magnetization is in the x-y plane
$t_i$ = inversion time
$t_w$ = delay time between FB pulse and the following excitation pulse
$T_1$ = longitudinal spin lattice relaxation time
$T_2$ = transverse spin-spin relaxation time
The times $t_i, t_c$, and and $t_w$ are also indicated in the second line of FIG. 1. The procedure according to the invention can be used with special fast imaging sequences, e.g. especially with the RARE technique.

FIG. 4 shows a different phase encoding than that used in FIG. 1 as indicated by gradient Gx in line two of FIG. 1 and labelled by 41, 42, 43 and 44. Herein, subsequent echo signals are subjected to different phase encoding gradients 41,43, whereby the respective compensation pulses 42,44 exhibit opposite phase. In accordance with the invention, the gradient fields Gx, Gy, and Gz of FIG. 1 are adjusted so that the spins contributing to subsequent echos 7,8,9 have the same phase as in the preceding spin-echo, and so that all spins are in phase at the time of application of the FB pulse 12 as was further described above in connection with FIG. 1. Here, with the flip-back pulse 12 in accordance with the invention, the usual long recovery time necessary to achieve the desired contrast can be substantially reduced.

Generally, the procedure according to the invention allows for the reduction of recovery time in acquiring individual spectra. In principal, it can be applied in all cases where a number of individual spectra have to be recorded, although it is of special interest for 3D tomography since here a large number of spectra have to be acquired and, in addition no further additional complications prohibit its use. The application of the FB pulse is more effective the shorter the actual scan-time. On the other hand the procedure according to the invention allows, in particular, for a contrast enhancement between areas with different relaxation times that are normally effective only after an extended scan time. That is why the flip-back pulse also achieves practical importance when applied at the end of extended spin-echo pulse sequences.

We claim:

1. Method for the measurement of nuclear magnetic resonance in selected regions of a body for the purpose of creating cross sectional images with which the body is subjected to a homogeneous magnetic field and to gradient fields and is irradiated with a sequence of pulses which includes an excitation pulse and a 180° pulse, whereby the sequence is ended with a FB pulse the beginning of which coincides with the maximum of the spin-echo produced by the last 180° pulse of the sequence, characterized in that at least two 180° pulses leading to spin-echos are irradiated, in that the application time and strength of the gradient fields are adjusted to the pulse sequence in such a manner that, at the time of occurrence of each 180° pulse, the same nuclear phase condition obtains as for the time of occurrence of the preceding 180° pulse, and in that a read gradient is applied at least during the time of occurrence of a spin-echo, whereby at the time at which the FB pulse is irradiated, the spin momenta generating the spin-echo are all in phase.

2. Method according to claim 1, characterized in that at least during the excitation pulse, a slice selection gradient is applied, and in that the excitation pulse is a slice selective pulse.

3. Method according to claim 1, characterized in that the 180° pulses are slice selective pulses which are irradiated in the presence of a slice selection gradient.

4. Method according to claim 1, characterized in that the excitation pulse is a 90° pulse.

5. Method according to claim 1, characterized in that the FB pulse has a phase opposite to that of the excitation pulse.

6. Method according to claim 1, characterized in that the direction of the read gradient is changed after each 180° pulse.

7. Method according to claim 1, characterized in that the gradient fields exhibit a phase encoding gradient whose strength and/or time extent is changed after each 180° pulse.

8. Method according to claim 1, characterized in that the gradient fields exhibit a phase encoding gradient and that a further phase encoding gradient is utilized, whereby the image signal is analyzed by means of a three dimensional Fourier transformation.

9. Method according to claim 1, characterized in that the excitation pulse is preceded by an additional 180° inversion pulse.

10. Method according to claim 1, characterized in that the time of irradiation of the FB pulse is so chosen as to optimize the signal to noise ratio for a given total measurement time.

11. Method for the measurement of nuclear magnetic resonance in selected regions of a body for the purpose of creating cross sectional images with which the body is subjected to a homogeneous magnetic field and to gradient fields and is irradiated with a sequence of pulses which includes excitation pulse and a 180° pulse, whereby the sequence is ended with a FB pulse the beginning of which coincides with the maximum of the spin-echo produced by the last 180° pulse of the sequence, characterized in that at least two 180° pulses leading to spin-echos are irradiated, in that the application time and strength of the gradient fields are adjusted to the pulse sequence in such a manner that, at the time of occurrence of each 180° pulse, the same nuclear phase condition obtains as for the time of occurrence of the preceding 180° pulse, in that a read gradient is applied at least during the time of occurrence of a spin-echo, whereby at the time at which the FB pulse is irradiated, the spin momenta generating the spin-echo are all in phase, in that at least during the excitation pulse, a slice selection gradient is applied, and in that the excitation pulse is a slice selective pulse, in that the 180° pulses are slice selective pulses which are irradiated in the presence of a slice selection gradient, in that the excitation pulse is a 90° pulse, and in that the FB pulse has a phase opposite to that of the excitation pulse.

12. Method according to claim 11, characterized in that the direction of the read gradient is changed after each 180° pulse.

13. Method according to claim 11, characterized in that the gradient fields exhibit a phase encoding gradient whose strength and/or time extent is changed after each 180° pulse.

14. Method according to claim 11, characterized in that the gradient fields exhibit a phase encoding gradient and that a further phase encoding gradient is utilized, whereby the image signal is analyzed by means of a three dimensional Fourier transformation.

15. Method according to claim 11, characterized in that the excitation pulse is preceded by an additional 180° inversion pulse.

16. Method according to claim 11, characterized in that the time of irradiation of the FB pulse is so chosen as to optimize the signal to noise ratio for a given total measurement time.

17. Method for the measurement of nuclear magnetic resonance to create cross sectional images with which a body is subjected to a homogeneous magnetic field and to gradient fields and is irradiated with an excitation pulse and a 180° pulse, whereby the sequence is ended with a FB pulse characterized in that at least two 180° pulses leading to spin-echos are irradiated and in that, at the time at which the FB pulse is irradiated, the spin momenta generating the spin-echo are all in phase.

18. Method according to claim 17, characterized in that the gradient fields exhibit a phase encoding gradient whose strength and/or time extent is changed after each 180° pulse.

19. Method according to claim 17, characterized in that the gradient fields exhibit a phase encoding gradient and that a further phase encoding gradient is utilized, whereby the image signal is analyzed by means of a three dimensional Fourier transformation.

20. Method according to claim 17, characterized in that the excitation pulse is preceded by an additional 180° inversion pulse.

* * * * *